(12) United States Patent
Brusic et al.

(10) Patent No.: US 6,174,606 B1
(45) Date of Patent: Jan. 16, 2001

(54) CORROSION AND DISSOLUTION PROTECTION OF A CONDUCTIVE SILVER/POLYMER COMPOSITE

(75) Inventors: Vlasta Agnes Brusic, Amawalk; Judith Marie Roldan, Ossining; Ravi F. Saraf, Briarcliff Manor, all of NY (US)

(73) Assignee: International Business Machine Corporation, Armonk, NY (US)

( * ) Notice: Under 35 U.S.C. 154(b), the term of this patent shall be extended for 0 days.

(21) Appl. No.: 08/976,923

(22) Filed: Nov. 24, 1997

Related U.S. Application Data

(63) Continuation of application No. 08/539,517, filed on Oct. 6, 1995, now abandoned.

(51) Int. Cl.[7] .................................................... B32B 27/38
(52) U.S. Cl. .................. 428/413; 174/52.1; 361/500; 427/79; 427/96; 427/103; 427/117; 428/901
(58) Field of Search ..................... 428/76, 695, 900, 428/413, 901, 689, 457; 427/96, 131, 79, 103, 117; 174/52 PE, 52.1; 361/386, 388, 392, 500; 357/72; 439/209, 211

(56) References Cited

U.S. PATENT DOCUMENTS 4,821,148 * 4/1989 Kobayashi et al. .

* cited by examiner

*Primary Examiner*—Bernard Pianalto
(74) *Attorney, Agent, or Firm*—Robert M. Tropp (57) ABSTRACT

A conductive composite is described containing silver particles and a polymer which covers each silver particle and wherein a heterocyclic organic compound containing nitrogen such as benzotriazole (BTA) is present to reduce Ag dissolution and ion mobility by forming a water insoluble complex with the Ag ion. The invention overcomes the problem of silver dissolution or corrosion a conductive composite as a result of normal high Ag ion mobility in the presence of moisture and an electric field.

24 Claims, 8 Drawing Sheets

CORROSION AND DISSOLUTION PROTECTION OF A CONDUCTIVE SILVER/POLYMER COMPOSITE

This is a continuation, of application Ser. No. 08/539,517, filed Oct. 6, 1995, now abandoned.

FIELD OF THE INVENTION

This invention relates to silver/polymer composites and more particularly to a chemical coating to form a Ag-complex in the composite to reduce silver dissolution and electrolytic migration.

BACKGROUND OF THE INVENTION

Insulating thermoset and thermoplastic polymers can be made conductive by loading them with metallic powder particles such as silver, palladium, tin, graphite or gold. The resulting conductive composite or paste has many potential applications. Such a material can be used for electrostatic discharge protection, electromagnetic interference shielding, and as an adhesive for interconnect technology that could replace PbSn solder. Ag is the metal of choice for these latter applications owing to its high conductivity and oxide free surface. The widespread use of Pb-containing solder in electronics is an environmental concern, and regulations banning Pb are being considered. Whereas Ag particles filled composite possesses high conductivity for interconnection applications, the corrosion and dissolution resistance are also of utmost importance specifically, when the interconnect are in close proximity less than 1mm. In order to be conductive, the composite has to have a high loading level, i. e. it should contain more than 50 weight % of the metal powder. Interconnections are expected to perform under a variety of environmental conditions, and with an applied voltage, where Ag ion dissolution can result in electrolytic migration, dendrite formation and eventually electrical shorts or opens. Thus, the susceptibility of the metal in the composite to dissolve in the presence of moisture under an applied potential indicates a problem for a device in operation.

In U.S. Pat. No. 4,821,148 which issued Apr. 11, 1989 to Kobayashi et al., a semiconductor device having an aluminum electrode, a lead frame having a silver electrode, and a copper wire connecting the electrodes was immersed in a solution of benzotriazole in ethyl alcohol for 3 minutes to form a metal-organic compound thereon. An Ag-benzotriazole film was formed on the surface of the silver electrode, a Cu-benzotriazole film was formed on the surface of the copper wire, and an Al-benzotriazole film was formed on the surface of the aluminum electrode. The films are effective in enhancing not only the corrosion resistance to water but also adhesion to the molding resin used to package the device.

SUMMARY OF THE INVENTION

In accordance with the present invention a structure is described having reduced electrochemical mobility of Ag when exposed to moisture comprising a first substrate having a first conductive region on a surface of the substrate, a conductive composite containing silver particles and a polymer, the conductive composite positioned on and in electrical contact with the first conductive region and a coating containing a heterocyclic organic compound containing nitrogen positioned on the conductive composite.

The heterocyclic organic compound may be selected from the group consisting of imidazole, benzimidazole, benzotriazole (BTA), and 5 methyl benzotriazole and derivatives thereof with chemical moities attached to the aromatic ring. The heterocyclic organic compound containing nitrogen may be a cyclic azo-compound containing nitrogen.

BRIEF DESCRIPTION OF THE DRAWINGS

These and other features, objects, and advantages of the present invention will become apparent upon consideration of the following detailed description of the invention when read in conjunction with the drawing in which.

DESCRIPTION OF THE PREFERRED EMBODIMENT

Polymer/metal composite (PMC) films were prepared in the laboratory with a high loading of silver particles to obtain dissolution data. For a further description of suitable electrically conductive pastes, composites and their use to form electrical interconnections, reference is made to U.S.

Pat. No. 5,866,044 Feb. 2, 1999 which is a continuation of Serial No. 08/339,609 filed Nov. 15, 1994 now abandoned entitled "Lead Free Conductive Composites for Electrical Interconnections" which is incorporated herein by reference.

Electrochemical tests were conducted in a droplet of triple distilled water with or without benzotriazole (BTA) and BTA derivatives. Work in the laboratory as well as in U.S. Pat. No. 4,821,148 above, has indicated that Ag forms a thin layer of Ag-BTA in a manner similar to Cu under the same conditions. Yet, the protective nature of Ag-BTA films is not well documented. Results herein are described in terms of observed protection offered by BTA and compared to the results obtained on a similar paste formulated with Au particles.

Polymer/silver conductive adhesive (PSCA) samples were prepared on a glass substrate as blanket films with dimensions of 1.9×3.2 cm and a thickness in the range from 25 to 40 $\mu$m. Ag or Au particles (with a typical loading factor of 88 weight %) were used in the preparation of the paste. Some of the samples had additions of 1000 ppm benzotriazole (BTA) to the composite prior to electrochemical evaluation of the corrosion behavior. Some of the samples were immersed for 10 minutes into an aqueous solution of $10^{-2}$M BTA prior to electrochemical evaluation of the corrosion behavior. Some of the samples were dipped for 3 minutes into an alcohol solution of BTA or 5 methyl BTA in concentrations of 0.02 and 0.2 M prior to electrochemical evaluation of the corrosion behavior in a selected electrolyte. The temperature of the alcohol-azole solution was controlled in the range from RT to 60° C.

Plating tape was used to expose an area of 0.32 cm$^2$ for electrochemical testing. The electrochemical cell also contained a Pt mesh as a counter electrode and a mercurous sulfate electrode (MSE, with saturated solution of $K_2SO_4$) as a reference electrode, that were separated by a filter paper. This cell design was described in a publication by V. Brusic et al., "Corrosion of Thin Film Magnetic Disk: Galvanic Effects of the Carbon Overcoat", J. Electrochem. Soc. 136,42, (1989) which is incorporated herein by reference. The cell was proven suitable for use with a small volume of an electrolyte, 0.01 ml or so, and with electrolytes that are normally difficult to handle or have low conductivity. Because of the closeness of the electrodes, the cell is suitable for tests in water without significant ohmic potential drop. The use of pure water as an electrolyte mimics the conditions that apply in processing (such as product rinsing) or in exposure to a humid atmosphere. The electrochemical tests consisted of corrosion potential measurement, which was interrupted in regular time intervals by measurement of linear polarization to determine the corrosion rate. After about 10 minutes, when the open potential reached a stable value (changing no more than 2 mV/min), a potentiodynamic sweep was applied. A sweep rate of 1 mV/sec was used, starting 250 mV below the corrosion potential and reaching 1.3 V vs. MSE. In several tests, dissolution of Ag paste was examined by an application of a constant anodic potential and a continuous recording of the current i. e. with potentiostatic control. The electrolyte was water, with or without BTA or an azole derivative.

Most of the electrochemical tests were conducted within hours of the paste preparation. Some of the experiments were performed after months of sample storage in either open containers, or in closed containers containing dry $CH_3$-BTA reservoir.

In a few experiments, using Ag foil, ellipsometry was used to determine the presence and thickness of Ag-azole films on the silver surface, and time-of-flight static SIMS was employed to determine the film composition.

Figure 1:
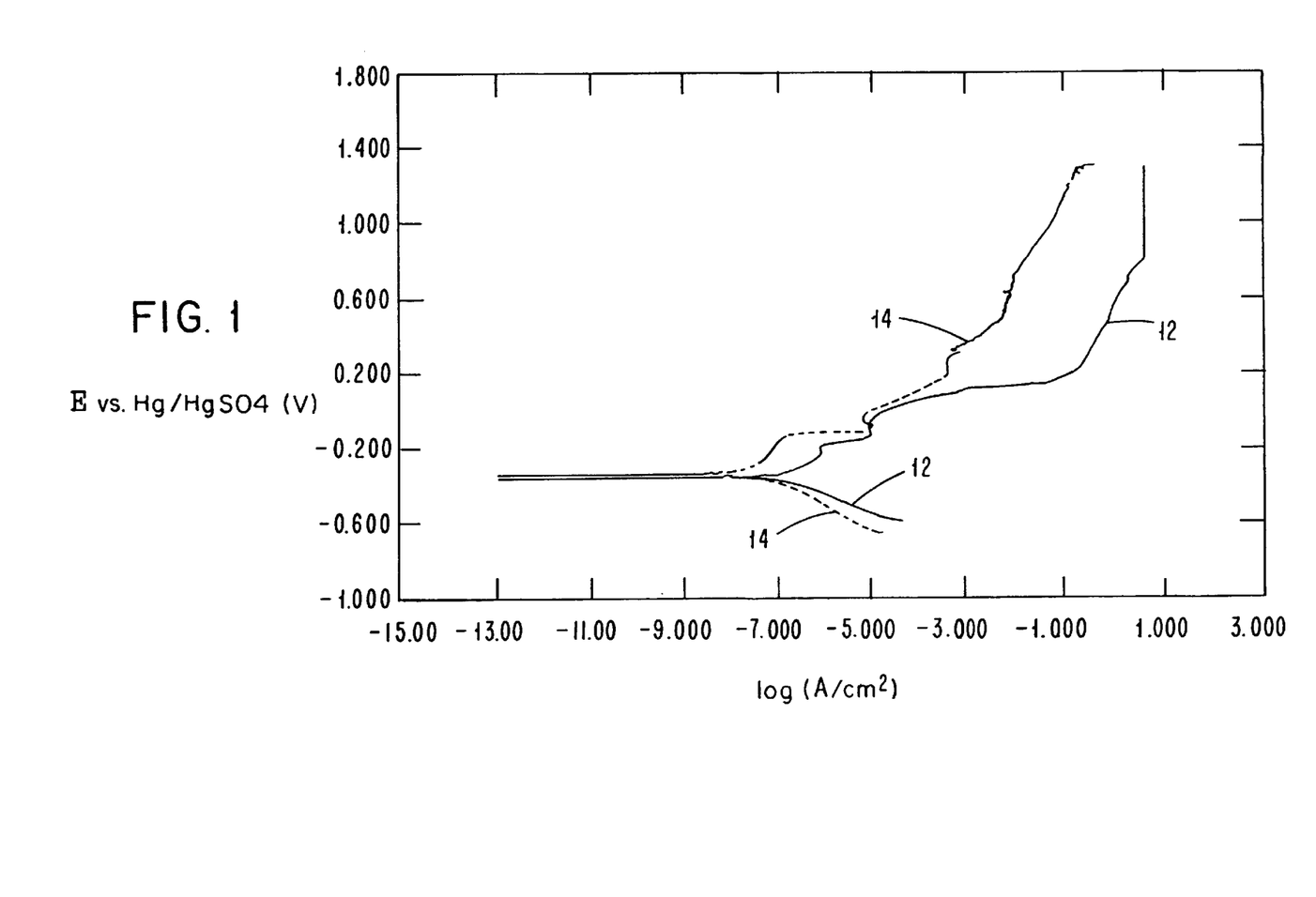
FIG. 1 is a graph showing potentiodynamic polarization curves for a Ag foil and a Ag composite samples measured in a droplet of water.

Anodic Dissolution of Silver—Although noble, silver dissolves in water saturated with air at a corrosion rate of about 1×10$^{-7}$ A/cm$^2$ or 0.002 nm/min. The results obtained with a pure silver foil are shown in FIG. 1. With increased anodic potential, silver dissolution rapidly increases, in spite of the thermodynamic prediction of higher-valent silver oxide formation (3). Apparently none of the oxides that are expected to form, $Ag_2O$, $Ag_2O_2$ and $Ag_2O_3$, are truly protective, and at high anodic potentials Ag dissolves with a current that (for the given experimental area) exceeds the measurable limit of the PAR 273 Potentiostat. The highest measured current density of 10 A/cm$_2$ corresponds to the dissolution rate of 3.6×10$^{+3}$ nm/second (with an assumption that at these anodic potentials Ag dissolves with a three electron exchange) . These very high anodic rates measured in water confirm what is already known from the anodic behavior of silver in aqueous solution (4) and vast experience in electronic industry (5): in the presence of humidity and bias, silver forms poorly passive, fairly soluble silver oxides. Dissolved ions increase the conductivity of the adsorbed water layers, easily migrate under the influence of the electric field and provide reactants for the cathodic reaction, which is deposition of Ag dendrites. Thus the magnitude of the anodic current in the water droplet is a relative measure of the vulnerability to form electrical shorts in interconnection applications.

Metal Coverage in the Conductive Composite—The corrosion rate measured as current density (per geometric area) on Ag paste is about an order of magnitude smaller than that of Ag foil, FIG. 1. This indicates that the actual area of the metal available for reaction is about 10% of the available area, or that the polymeric coverage for this particular paste is about 90%. The remnant area has either no film or a very thin film of insulating polymer.

Figure 2:
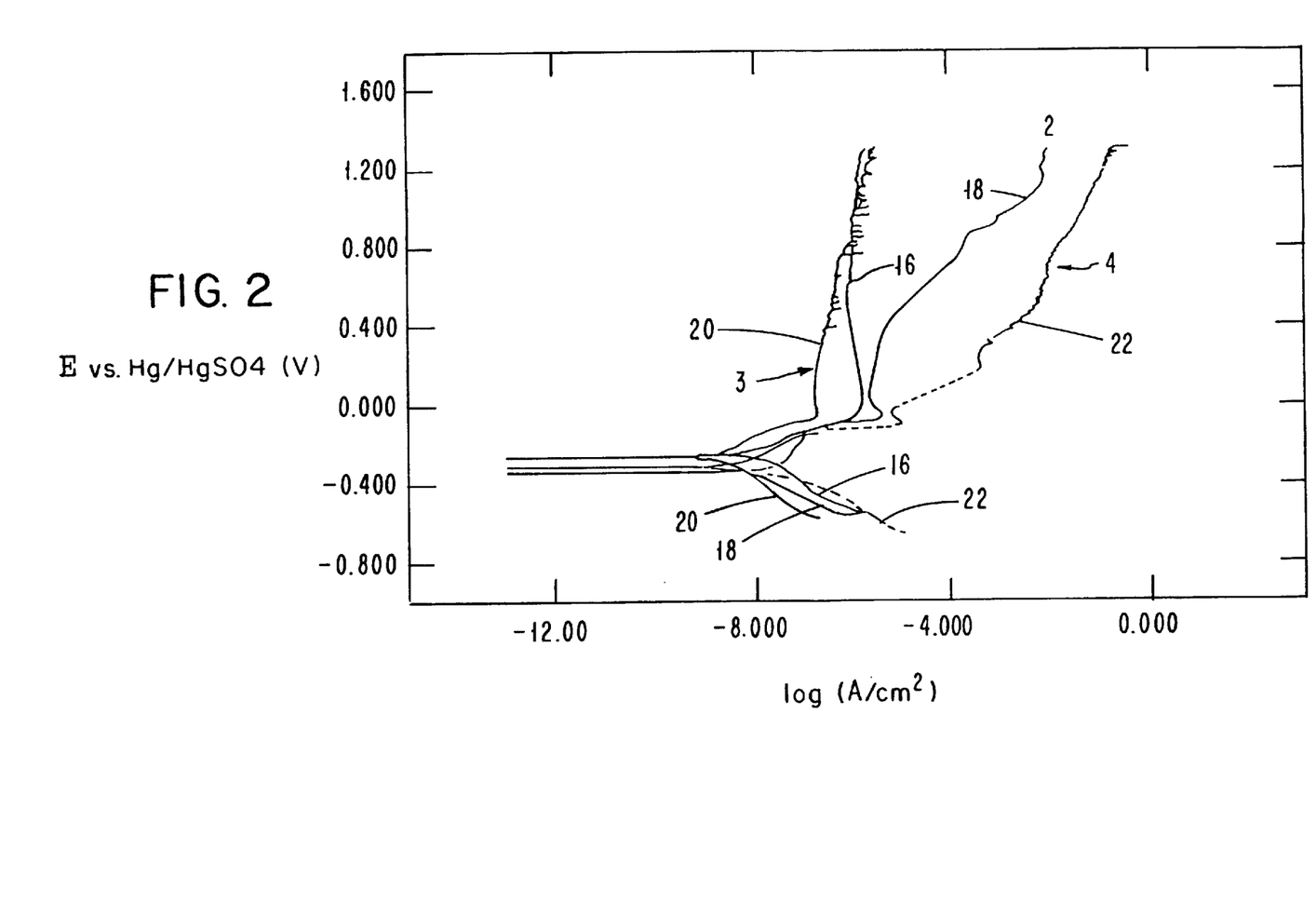
FIG. 2 is a graph showing potentiodynamic polarization curves measured on a Au film and a Au paste.

Dissolution of Au Paste—In comparison to the Ag paste, the PMC film with Au particles has significantly lower currents both at the corrosion potential as well as at high anodic potentials, FIG. 2. As in the case of Ag, the apparent metal coverage in the paste is about 90%, judging from the dissolution rates at the corrosion potential. The Au paste is possibly contaminated with some Ag (from previous milling of the Ag paste during formulation) that could explain the observed current peak below 0 V. Both Au and Au paste show relatively low anodic currents below about 0.8 V. The measured current density of about 10$^{-7}$ A/cm$^2$ is about an order of magnitude higher than the current due to charging of the double layer during the scan. For a double layer capacitance of 20 $\mu$/cm$^2$, the capacitive current would be approximately 2×10$^{-8}$ A/cm$^2$. If the anodic current were caused by Au dissolution, an average Au removal rate would be 1.1×10$^{-3}$ nm/second. The increase of the anodic current at potentials above 0.8 V is attributed to the evolution of oxygen, which proceeds much slower than does the dissolution of Ag at the same potentials.

Figure 3:
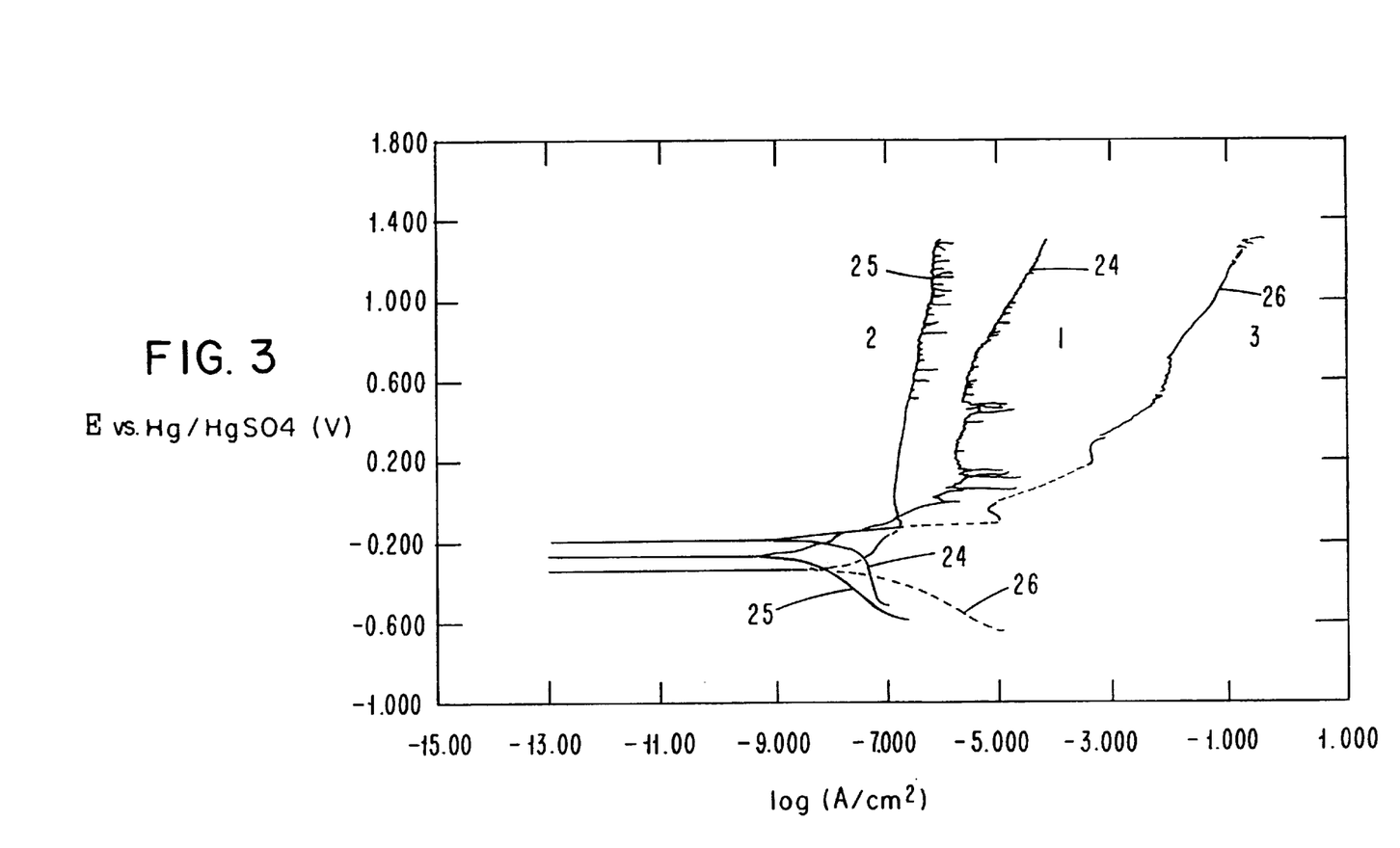
FIG. 3 is a graph showing potentiodynamic polarization curves measured on a Ag composite. The curves measured a Ag paste in aqueous solution of 0.01M BTA (1), and in triple distilled water (2 and 3) on Ag paste immersed for 3 minutes into an alcohol azole solution kept at 60° C. prior to the measurements in water (2, alcohol contained 0.2M BTA; 3, alcohol contained 0.2M $CH_3$BTA alcohol). Data obtained on untreated Ag paste in water are plotted for a comparison (4).

Effect of BTA and $CH_3$BTA on Dissolution of Ag-Potentiodynamic curves measured in water with 10$^{-2}$M BTA show remarkable reduction of the Ag dissolution rate, FIG. 3. An increase of the corrosion potential and a decrease of the corrosion rate suggest that the presence of this inhibitor slows down preferentially the anodic reaction in the overall corrosion process, similarly as reported for the effect of BTA on Cu corrosion (6). Differently than in the case of copper, however, BTA is even more effective at high anodic potentials, with the average dissolution rate being more than four orders of magnitude lower than measured in water alone. Moreover, the anodic dissolution rate of Ag paste in the presence of BTA is almost as slow as the rate measured on pure Au paste.

Ellipsometric data on Ag foil that was immersed in the aqueous BTA solution, rinsed in water and $N_2$-dried, show a formation of a surface film with a thickness of about 3 nm. This is very close to the thickness of Cu-BTA film that is normally formed on oxidized Cu surface under similar circumstance, i. e. 2.5 nm (6, 7), and thicker than the measured BTA films that weakly adsorb on metals, such as Fe, Ni or Al, where the BTA-film thickness is less than 0.5 nm. Time-of-flight static SIMS data indicate that the film is Ag-BTA. $Ag^+$ ions most likely occupy the same site in the benzotriazole ring as the $Cu^+$ ions in Cu-BTA complex. However, in contrast to Cu-BTA on Cu, thin Ag-BTA on Ag shows only a marginal protection against corrosion when re-tested for the corrosion in water without a BTA reservoir. At higher anodic potential, effects of prior exposure to BTA are not at all noticeable. Thus, truly beneficial effects of the azoles were observed only when this inhibitors were present in a solution as a reservoir.

As the thermal instability of BTA and its derivatives is well documented (6, 7), additions of BTA to the paste during fabrication were not expected to be successful in a preparation of a built-in azole reservoir. This was indeed confirmed by experiments. However, immersion of the finished composite into an alcohol-azole solution resulted in a surface film that offered a significant protection in subsequent exposure to water, FIG. 3. Visual observation and ellipsometric investigation of the Ag foil immersed in an alcohol-azole solution and dried (without rinsing) show a presence of a thick, white film. After rinsing in alcohol, the foil retains its shine, and ellipsometry indicates the presence of a film that is about 3 nm thick. Thus, as well as forming a thin Ag-BTA complex, the process apparently blocks the pores in the paste by a precipitated, non-complexed, azole.

The beneficial effect of the built-in azole reservoir increased with an increase in concentration and temperature of the azole-alcohol solutions. The most effective, reproducibly measured protection, was observed with concentrated azole solutions (0.2 M or more) applied at 50° or 60° C. for 3 minutes. Of the two azoles that were tested, $CH_3BTA$ offered more effective protection. In the best cases, such reservoirs decreased the anodic dissolution in water four (with BTA) to five (for $CH_3BTA$) orders of magnitude. Under the best conditions, Ag dissolution approached the values measured on Au paste in water, with the Au paste still being better by an order of magnitude.

One of the most important property of the paste, its electrical conductivity, is not changed by application of the azole reservoir. There are, however, some possible shortcomings of this treatment, such as its effects on the appearance and on the surface conductivity of the treated part. The altered surface appearance is a consequence of the azole application without rinsing, with a residual, non-uniform, film present over the entire exposed area. Its effect on surface conductivity cannot be easily predicted. By itself, this film is not conducting, and it should not cause electrical failures in the circuits. Dissolved in water, BTA increases solution conductivity: 0.01M BTA is 10× more conductive than water alone. Thus, when the parts get exposed to an elevated relative humidity, dissolution of the azole in the adsorbed water layer should increase the conductivity of that film. The surface wetting, however, is expected to decrease for azole treated surface (8). The overall effect of the azole film on the behavior of an electronic circuit exposed to humidity and bias will be experimentally evaluated at a future time.

Figure 4:
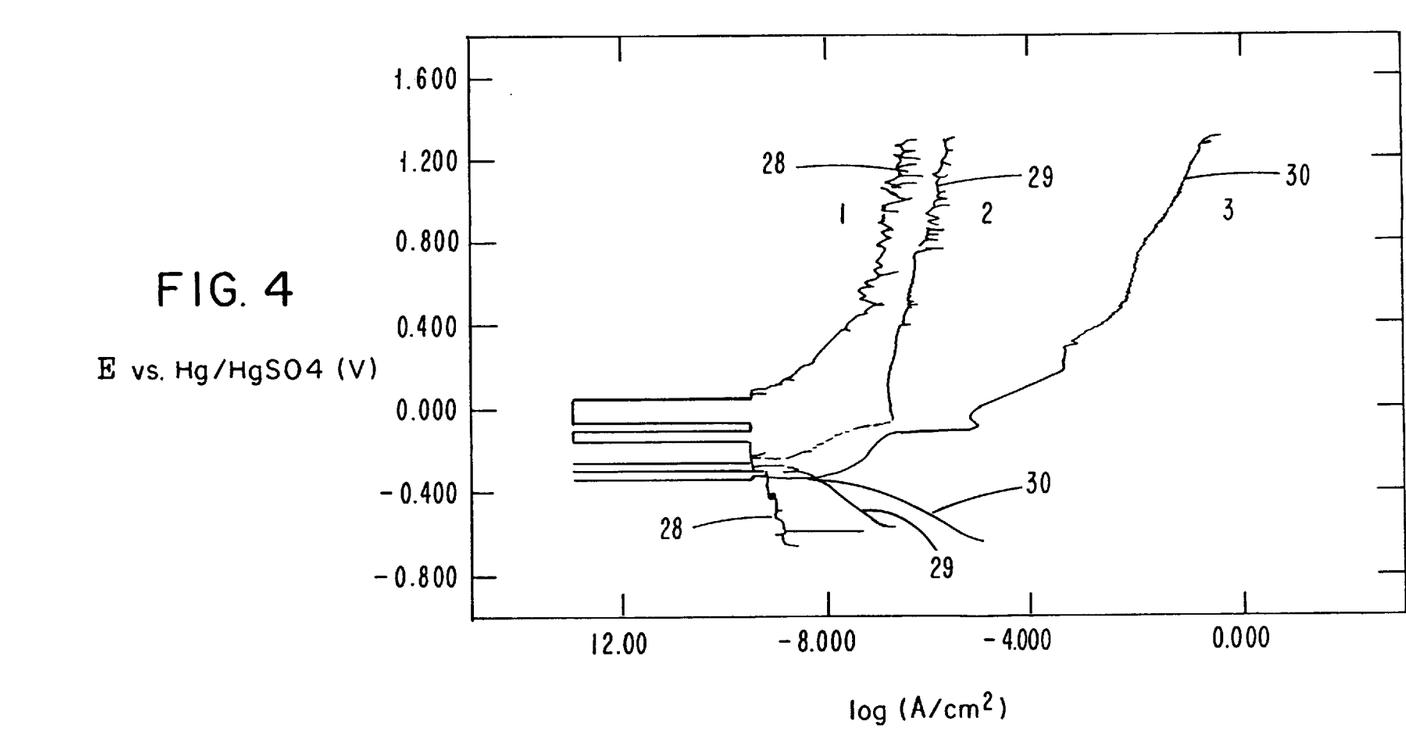
FIG. 4 is a graph showing potentiodynamic curves measured in water on Ag composite after treatment with $CH_3$-BTA/alcohol mixture measured after 4 months of storage in an open container (curve 1). Results on unprotected paste (curve 3) and on protected paste, measured hours after the treatment (curve 2) are given for a comparison.
Figure 5:
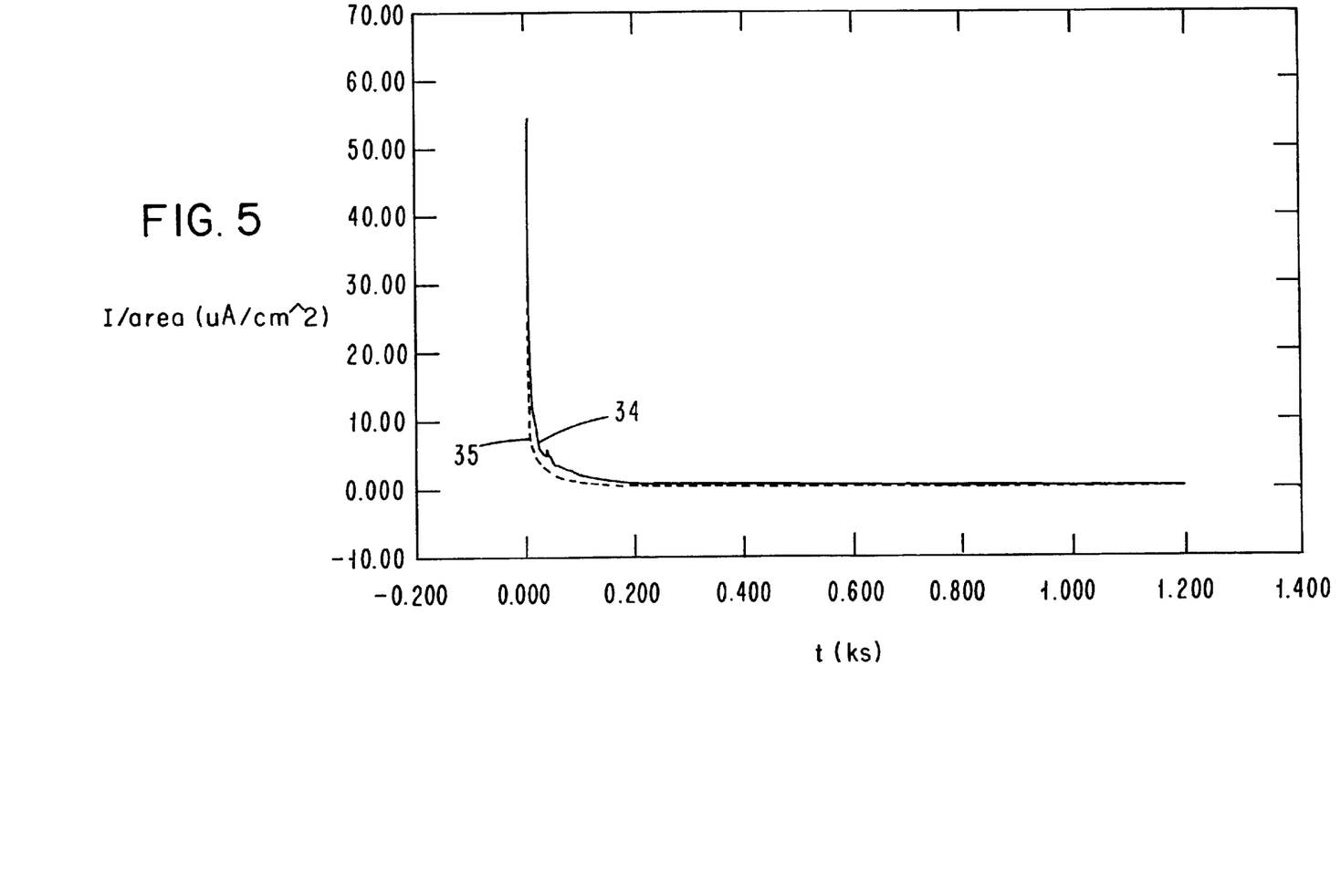
FIG. 5 is a graph showing potentiodynamic curves measured in water on a Ag composite after treatment with $CH_3$-BTA/alcohol mixture and 4 months storage at room temperature in a closed container with a surplus of $CH_3$-BTA powder (curve 1). Results on unprotected paste (curve 3) and on protected paste, measured hours after the treatment (curve 2) are given for a comparison.
Figure 6:
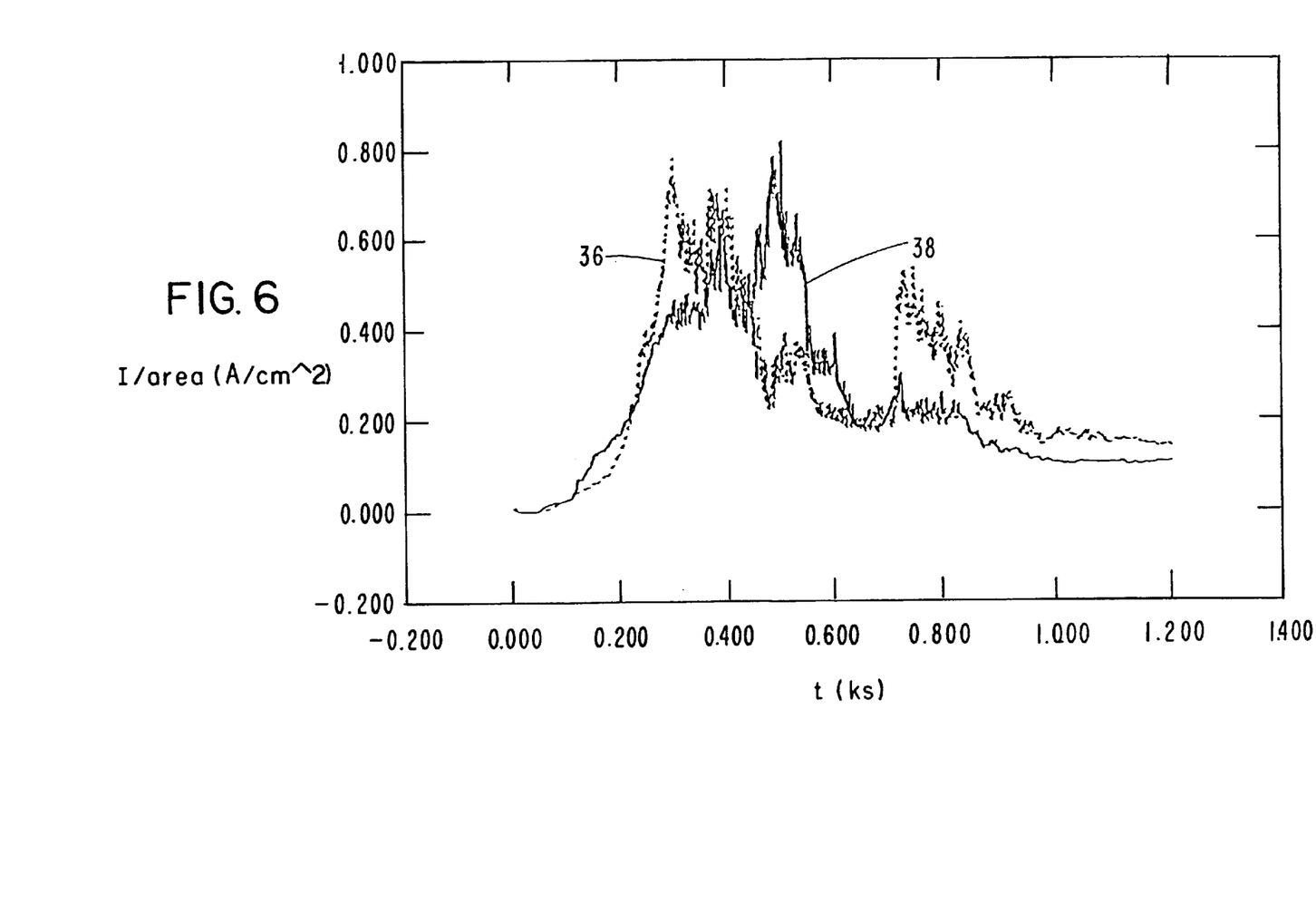
FIG. 6 is a graph showing the variation of current density with time during potentiostatic oxidation of azole-alcohol treated paste at 0.5 V (dashed line) and 1.0 V MSE (solid line) in water. Sample was stored in azole containing container for six months prior to the electrochemical test.
Figure 7:
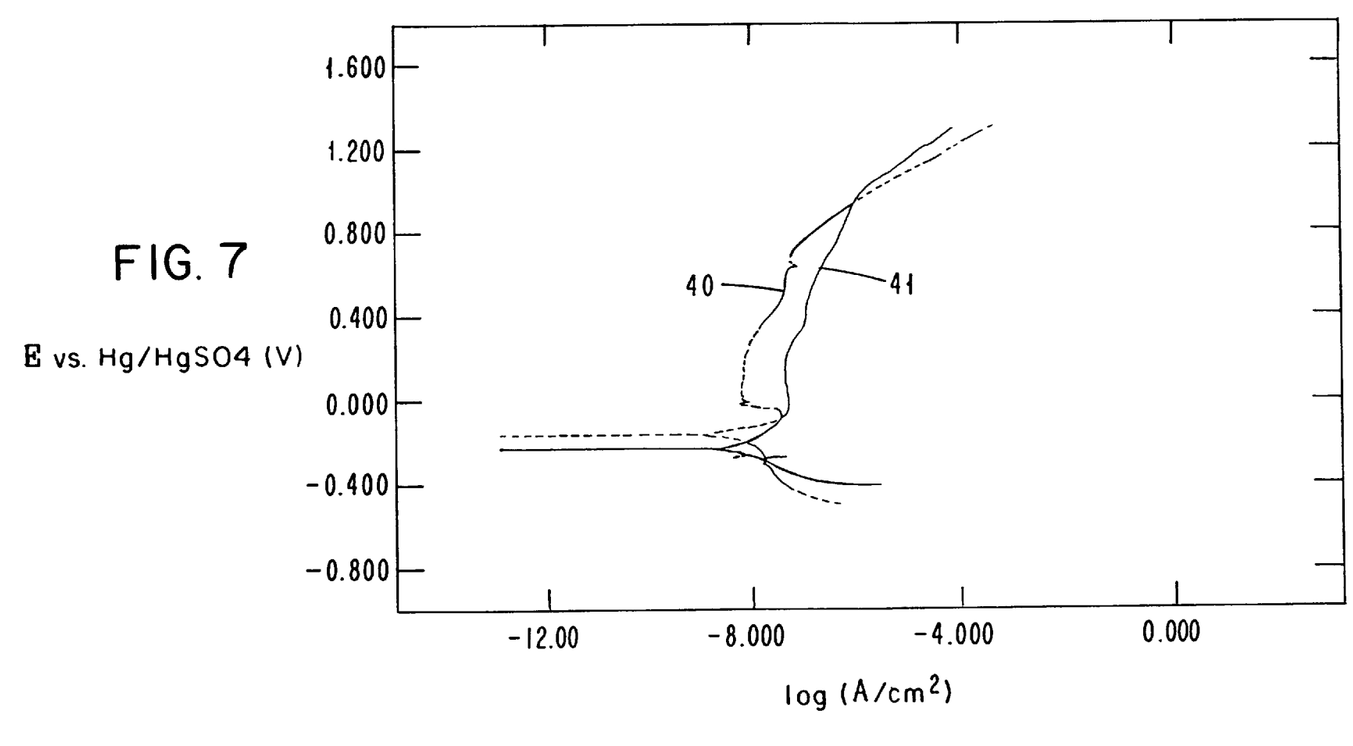
FIG. 7 is a graph showing the variation of current density with time during potentiostatic oxidation of un-treated Ag paste at 0.15 V. Results of two separate experiments are plotted.

The potentiodynamic curves recorded on samples that were treated with the azole-alcohol solutions show some level of current instability (FIGS. 3–5). The origin of the recorded noise is not fully understood, but it might be rooted in somewhat dynamic wetting of the rough composite surface, a fast localized dissolution of Ag, and a delayed reaction of Ag-ions with dissolved azole. In contrast, anodic currents obtained on azole-alcohol treated samples in potentiostatic experiments are very stable. FIG. 6 shows the current density-time curves for a sample treated with $CH_3$-BTA and stored in a closed container with a surplus of azole for more than 6 months and then oxidized in water at 0.5 and 1.0 V MSE, respectively, for 20 minutes. Similar data for un-treated paste oxidized at 0.15 V are shown in FIG. 7. The steady state current densities follow closely the behavior predicted from the potentiodynamic polarization curves, FIG. 1 and 5. Oxidation of Ag is fast, causing noticeable surface roughening, dissolution and precipitation of silver oxides, all resulting in a large variation in current density. Dissolution rate is of the order of magnitude of 0.15 $A/cm^2$ at 0.15 V, FIG. 7. (In comparison, currents obtained on Ag foil are higher and even more noisy.) The azole-alcohol treated sample shows a dissolution rate below $1\times10^{-8}$ $A/cm^2$ at 0.15 V, $3.7\times10^{-8}$ A/cm(2) at 0.5 V and $3.1\times10^{-7}$ $A/cm^2$ at 1.0 V. Thus, again, the reduction of the dissolution rate provided by the azole-alcohol treatment is at least five orders of magnitude.

Both BTA and $CH_3$-BTA have relatively high vapor pressure (0.09 and 0.02 mm Hg at 40° C., respectively), and the paste protection by a non-complexed azoles should decrease with time. Thus the electrochemical tests were repeated four months after the application of the $CH_3$-BTA/alcohol treatment with some films being stored in an open container and some in a closed container that also had an added $CH_3$-BTA powder. The results are given in FIG. 4 and 5. Sample stored in an open container has somewhat higher corrosion rate as well as dissolution rate at higher anodic potentials than measured immediately after $CH_3$-BTA application, but the dissolution is still about 4 orders of magnitude slower than measured on unprotected paste, FIG. 4. Sample stored in a close container with a reservoir of $CH_3$-BTA powder has improved its corrosion and dissolution resistance, and its overall activity is smaller than measured on Au paste, FIG. 5.

The polymer used in the paste fabrication provides coverage of more than 90% for Ag particles, and a corresponding decrease of the Ag corrosion and dissolution. In spite of the protection, the dissolution of silver at anodic potentials reaches the current density of $10^{-1}$ $A/cm^2$, which far exceeds the rate of oxygen evolution and corresponds to the rate of Ag removal of at least 35.6 nm/second.

In an aqueous solution containing BTA, the anodic dissolution of Ag particles is greatly reduced. The behavior of the paste becomes similar to that of Au paste except for the fact that even the oxygen evolution reaction is greatly suppressed.

A wet or dry reservoir with either BTA or $5CH_3BTA$ can be built into the composite by a short immersion of the composite into an alcohol-azole mixture at elevated temperature followed by nitrogen drying. The bulk of the residual film is composed from the non-complexed BTA or $5CH_3BTA$. Because of their relatively high vapor pressure, (0.09 mm Hg for BTA and 0.02 mm Hg for $5CH_3BTA$), these films should disappear with time. $5CH_3BTA$ is both better protector and more stable than BTA. The effective protection of either of these films can be prolonged indefinitely, if they are kept in an enclosure with a solid azole reservoir.

Figure 8:
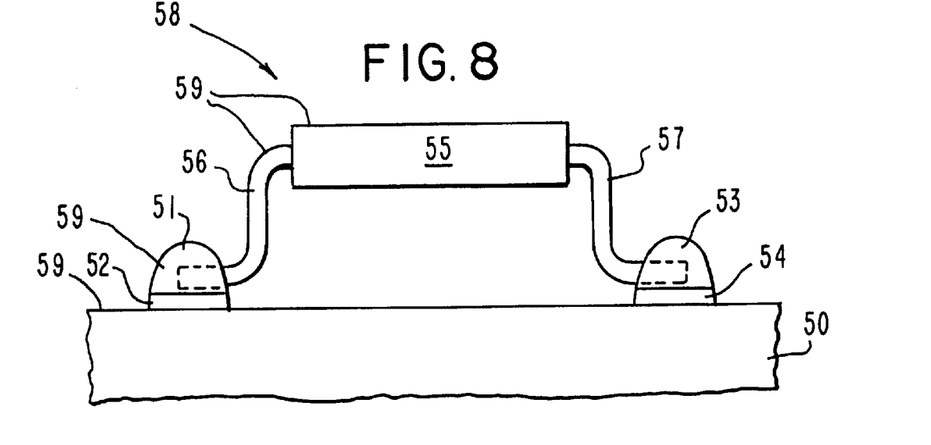
FIG. 8 is a schematic representation of a conductive composite and a coating thereon to provide corrosion free surface mounting of an integrated circuit chip in a leadframe to a printed circuit board.

Referring to FIG. 8, a printed circuit board 50, which may be an organic polymer, a ceramic or the like, is provided with a plurality of terminal points, electrical contacts, pads, or conductive regions 52 and 54. Electrical contacts 52 and 54 are in electrical communication or electrical contact with an integrated circuit chip in lead frame 55 by means of wires or conduits 56 and 57, thus providing electrical communication between printed circuit board 50 and integrated circuit chip in lead frame 55. A conductive composite 51 and 53 are placed on electrical contacts 52 and 54. Wires 56 and 57 are embedded in composites 51 and 53 respectively. The assembly 58 is heat treated to set the composite to a solid from its previous paste condition. An elevated temperature above the glass transition temperature of the polymer and sufficient load, preferably at least equal to the combined weight of the lead frame 55 and the wires 56 and 57 may be used. The assembly 58 may be dipped in a solution of BTA to form a coating 59 of BTA on conductive composites 51 and 53. Coating 59 will also be on all exposed surfaces of printed circuit board 50, wires 56 and 57, electrical contacts 52 and 54, and lead frame 55. In place of lead frame 55, a surface mount device containing a resistor, capacitor, inductor, or integrated circuit chip may be attached. Subsequent forming coating 59, assembly 58 may be encapsulated with a suitable encapsulant.

Figure 9:
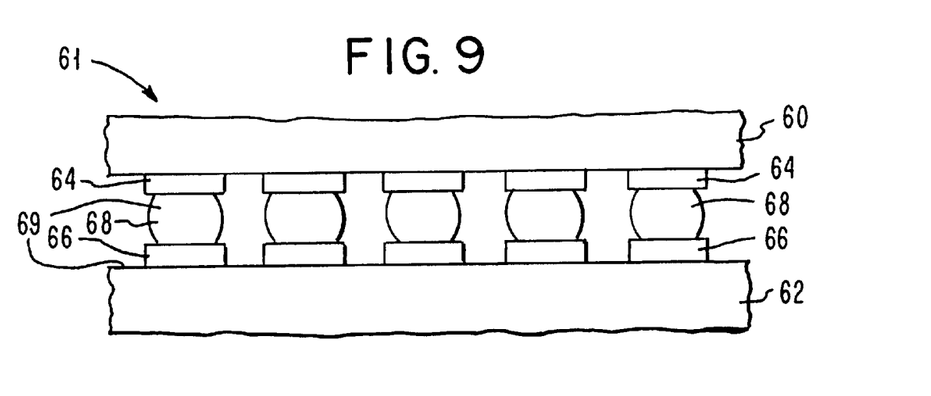
FIG. 9 is a schematic representation of a "flip chip" attachement between an integrated circuit chip and a printed circuit board utilizing a conductive paste and a coating thereon.

FIG. 9 is a schematic diagram of assembly 61 wherein a "flip chip" 60 is attached to printed circuit board 62. A "flip chip" attachment by a prior known process is described in U.S. Pat. No. 4,434,434 which is incorporated herein by reference. A "flip chip" attachment permits the bonding of an integrated circuit chip directly to a circuit board by means other than wiring therebetween. In the present invention flip chip attachment is accomplished by employing the conductive composite 68. A chip 60 is "flipped," that is, turned upside down, so that the pads 64 on its surface are aligned with the pads 66 of circuit board 62. Small amounts of the electrically conductive paste 68 are disposed between the pads 34 and the pads 66 such that there is electrical communication therebetween. Assembly 61 is thereupon subjected to elevated temperature and pressure, preferably at least about 5 psi, to convert paste 68 to composite 68 to make this electrical communication permanent. A coating 69 may be applied to composite 68 by dipping assembly 61 in a solution of BTA and a solvent. An atomized spray may be used to apply BTA in droplet form.

Figure 10:
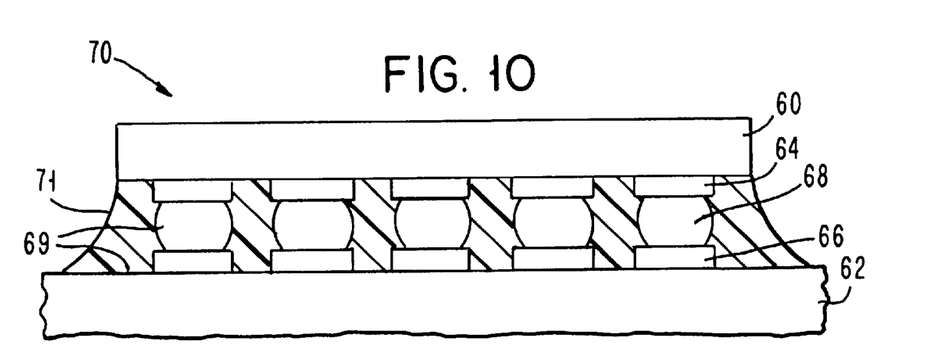
FIG. 10 is a cross section view of a "flip chip" attachement as shown in FIG. 9 with the addition of an encapsulant.

FIG. 10 is a cross section view of assembly 61 shown in FIG. 9 with an encapsulant 70 such as for example epoxy resin encapsulating composite 38 and coating 69.

One of the possible uses for a conductive paste is as an adhesive in interconnect technology that could replace PbSn solder. The interconnections are expected to perform under a variety of environmental conditions, and with an applied voltage. Thus knowledge of their corrosion and dissolution resistance is of utmost importance. This is a study of the dissolution and protection of polymer/metal composite (PMC) films, prepared with a high loading of silver or gold particles. Electrochemical tests were conducted in a droplet of triple distilled water with or without benzotriazole (BTA) and BTA derivatives. Results indicate that, in spite of some protection obtained by the polymer, silver paste dissolution at high anodic potentials is rapid, reaching values of $10^-$ A/cm$^2$, which corresponds to a catastrophic silver removal rate of at least 35.6 nm/second. With a reservoir of azole in the corrosive environment, this rate can be reduced by up to five orders of magnitude. This azole effect greatly reduces the probability of electrolytic silver migration, but the Ag dissolution rate is still higher than the anodic activity shown by Au paste under the same conditions.

While there has been described and illustrated a conductive silver/polymer composite containing a heterocyclic organic compound containing nitrogen that forms a water insoluble complex with Ag ions, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A structure comprising:
    a first substrate having a first conductive region on a surface of said substrate,
    a conductive composite containing silver particles and at least one polymer, said conductive composite positioned on and in electrical contact with said first conductive region, and
    a coating containing a heterocyclic organic compound containing nitrogen positioned on said conductive composite forming a Ag heterocyclic organic compound complex and a precipitated non-complexed heterocyclic organic compound in pores of said conductive composite whereby said structure has reduced electrochemical mobility of Ag when exposed to moisture.

2. The structure of claim 1 wherein said heterocyclic organic compound is selected from the group consisting of imidazole, benzimidazole, benzotriazole (BTA), and 5 methyl benzotriazole and derivatives thereof with chemical moities attached to the aromatic ring.

3. The structure of claim 1 wherein Ag ions formed from said silver particles form a water insoluble Ag complex with said heterocyclic organic compound.

4. The structure of claim 1 wherein said coating is present at the interface of said conductive composite and said first conductive region.

5. The structure of claim 1 wherein molecules of said heterocyclic organic compound are distributed in said polymer.

6. The structure of claim 5 wherein the concentration of molecules of said heterocyclic organic compound are distributed in said polymer to form a concentration gradient from said coating.

7. The structure of claim 1 further including an electrical component having a second conductive region in electrical contact with said conductive composite and wherein said coating is present at the peripheral interface of said conductive composite and said second conductive region.

8. The structure of claim 7 wherein said second conductive region is a wire embedded in said conductive composite.

9. The structure of claim 1 wherein said coating includes a cyclic azo-compound.

10. The structure of claim 1 wherein said at least one polymer forms a coating on said silver particles.

11. A structure comprising:
    first and second spaced apart electrical contacts,
    a conductive composite containing silver particles and at least one polymer, said conductive composite positioned between and in electrical contact with said first and second electrical contacts, and
    a coating of a heterocyclic organic compound containing nitrogen in physical contact with said conductive composite forming a Ag heterocyclic organic compound complex and a precipitated non-complexed heterocyclic organic compound in pores of said conductive composite whereby said structure has reduced electrochemical mobility of Ag when exposed to moisture.

12. The structure of claim 11 wherein said heterocyclic organic compound containing nitrogen is selected from the group consisting of imidazole, benzimidazole, benzotriazole (BTA), and 5 methyl benzotriazole and derivatives thereof with chemical moities attached to the aromatic ring.

13. The structure of claim 11 wherein said conductive composite is encapsulated with an organic encapsulant.

14. The structure of claim 13 wherein said organic encapsulant is selected from the group consisting of an epoxy resin and a thermosetting resin.

15. The structure of claim 11 wherein Ag ions from said silver particles form a water insoluble compound or complex with said heterocyclic organic compound.

16. The structure of claim 11 wherein said heterocyclic organic compound diffuses through said polymer to said silver particles.

17. The structure of claim 11 wherein said coating includes a cyclic azo-compound.

18. The structure of claim 17 wherein said first electrical contact is on an integrated circuit chip.

19. The structure of claim 11 wherein said first and second electrical contacts are on separate substrates.

20. The structure of claim 11 wherein said first electrical contact is a wire embedded in said conductive composite.

21. The structure of claim 11 wherein said first electrical contact is on a surface mount device.

22. The structure of claim 21 wherein said surface mount device is a resistor.

23. The structure of claim 21 wherein said surface mount device is capacitor.

24. The structure of claim 11 wherein said first and second electrical contacts are on the same substrate.

* * * * *